US 7,067,360 B2

(12) United States Patent  (10) Patent No.: US 7,067,360 B2
Lee  (45) Date of Patent: Jun. 27, 2006

(54) METHOD OF FABRICATING A FIN FIELD EFFECT TRANSISTOR

(75) Inventor: Byeong Ryeol Lee, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/024,518

(22) Filed: Dec. 28, 2004

(65) Prior Publication Data

US 2005/0142738 A1  Jun. 30, 2005

(30) Foreign Application Priority Data

Dec. 30, 2003  (KR) ....................... 10-2003-0100533

(51) Int. Cl.
*H01L 21/00* (2006.01)
(52) U.S. Cl. ...................... 438/151; 438/149; 438/283; 438/517
(58) Field of Classification Search ................ 438/149, 438/151, 283, 517
See application file for complete search history.

(56) References Cited

U.S. PATENT DOCUMENTS 6,413,802 B1 *  7/2002  Hu et al. ..................... 438/151
6,794,718 B1 *  9/2004  Nowak et al. .............. 257/347
6,815,268 B1 * 11/2004  Yu et al. ..................... 438/149

* cited by examiner

*Primary Examiner*—Christian D. Wilson
*Assistant Examiner*—Douglas M. Menz
(74) *Attorney, Agent, or Firm*—Andrew D. Fortney

(57) ABSTRACT

A method of fabricating a fin field effect transistor is disclosed. An example method forms a thermal oxide layer as a hard mask for etching a silicon fin on an SOI substrate, transcribes a fin pattern, forms a fin FET body by etching using the fin pattern as an etch mask, and restores a sidewall damaged by the etching remove a sacrificial silicon oxide layer. The example method also deposits a high-K dielectric as a gate dielectric, deposits a metal layer, planarizes the metal layer to a height of a hard oxide, forms a nitride layer on the planarized metal layer, and patterns the nitride layer using a hard mask for forming a pattern to form a nitride layer pattern. Additionally, the example method forms a metal gate using the nitride layer pattern, removes a remaining hard oxide mask, and grows a sidewall oxide layer on the metal gate.

3 Claims, 2 Drawing Sheets

(1) Buried Oxide
(2) Si
(3) Pad Oxide
(4) Si3N4
(5) Poly Silicon Gate
(6) Gate Dielectric

METHOD OF FABRICATING A FIN FIELD EFFECT TRANSISTOR

RELATED APPLICATION

This application claims the benefit of Korean Application No. P2003-0100533 filed on Dec. 30, 2003, which is hereby incorporated herein by reference in its entirety.

TECHNICAL FIELD

The present disclosure relates to a method of fabricating a semiconductor device and, more particularly, to a method of fabricating a fin field effect transistor by which an electrically stable fin field effect transistor can be implemented

BACKGROUND

Generally, as a scaling of a bulk transistor reaches its process limit, a fin field effect transistor (hereinafter abbreviated FET) having a single or dual gate becomes more desirable. FIG. 1 is a cross-sectional diagram of a known fin FET. Referring to FIG. 1, polysilicon is used as a material of a gate 5 and a gate oxide layer 6 is formed of SiO2 as a gate dielectric. However, even if a degree of device integration is raised using the fin FET, a threshold voltage of an NMOS or PMOS device due to a work function difference in case of using polysilicon for a bulk transistor varies, thereby degrading a stable operation of the device. Additionally, leakage current is generated due to the SiO2 layer as the gate oxide layer, which may prevent the device from operating stably.

DETAILED DESCRIPTION

In general, the example methods and apparatus described herein provide a method of fabricating a fin field effect transistor in which metal and high-K dielectric are used as a gate material and a gate dielectric, respectively, and in which a variation of a threshold voltage of a PMOS/NMOS device due to a work function difference is appropriately adjusted, and in which leakage current can be reduced.

One example method includes forming a thermal oxide layer as a hard mask for etching a silicon fin on an SOI substrate, transcribing a fin pattern, forming a fin FET body by etching using the fin pattern as an etch mask, restoring a sidewall damaged by the etching in a manner of growing to remove a sacrifice silicon oxide layer, depositing a high-K dielectric as a gate dielectric, depositing a metal layer, planarizing the metal layer to a height of an hard oxide mask, forming a nitride layer on the planarized metal layer, patterning the nitride layer using a hard mask for forming a pattern to form a nitride layer pattern, forming a metal gate using the nitride layer pattern, removing a remaining hard oxide mask, and growing a sidewall oxide layer on the metal gate.

Preferably, one selected from the group consisting of HfO2, Ta2O5, and ZrO2 is used as a raw material of the high-K dielectric. Also, preferably, the metal gate is formed of one selected from Ru—Ta, TaN, and Mo based metals.

Figure 1:
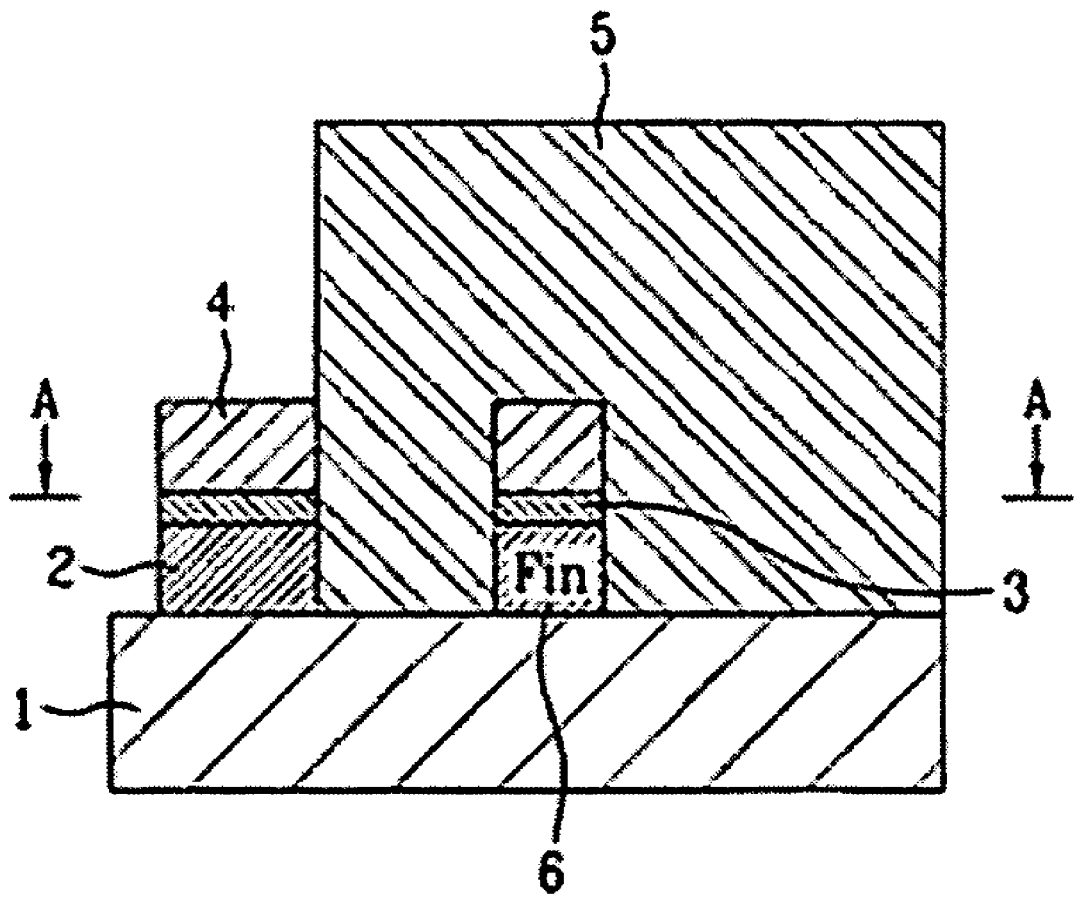
FIG. 1 is a cross-sectional diagram of a known fin FET.
Figure 2:
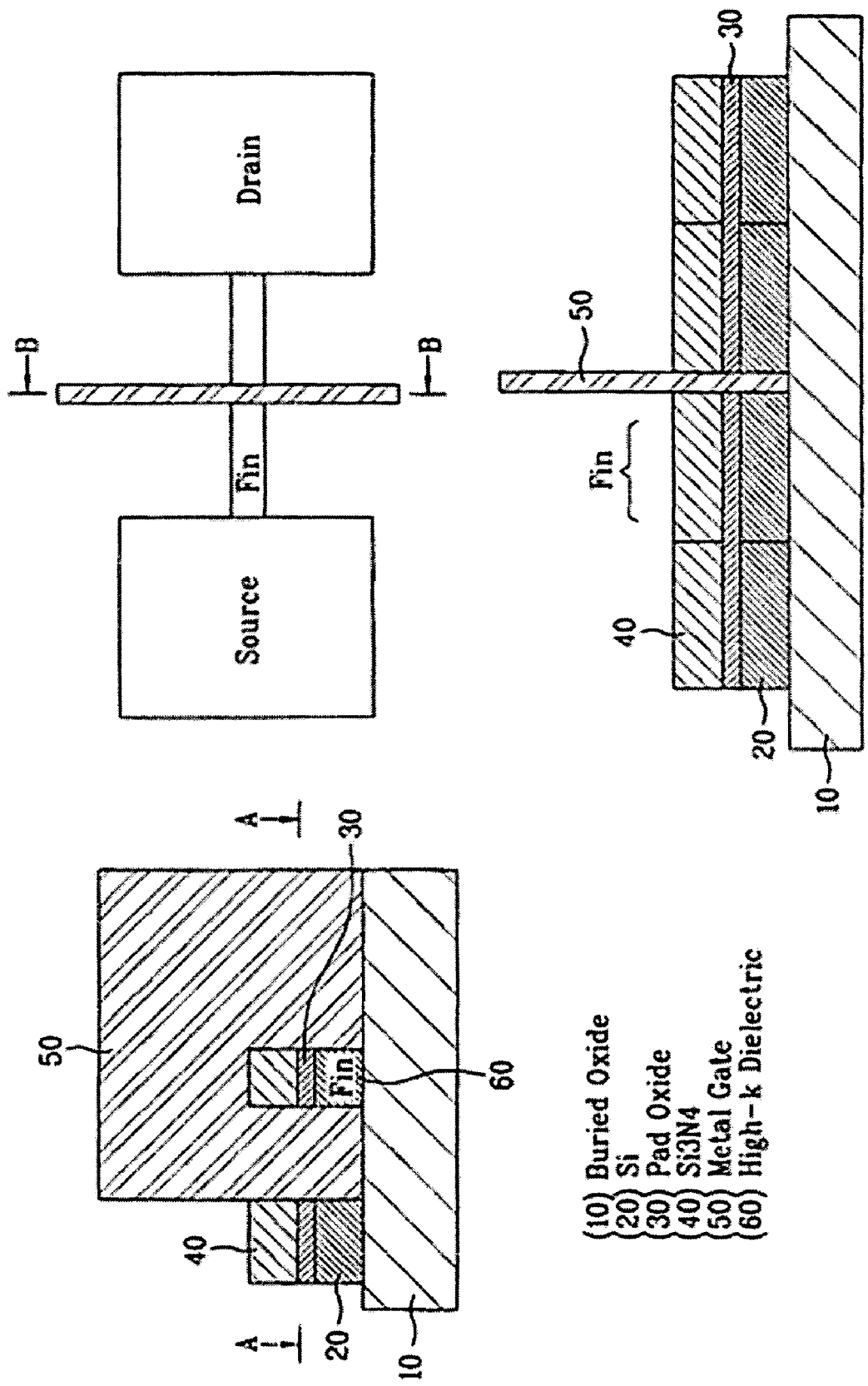
FIG. 2 is a diagram depicting an example method of fabricating a fin FET.

Now referring to FIG. 2, a thermal oxide layer is grown on an SOI (silicon on insulator) substrate having a buried oxide layer 10 about 400 nm thick and a P or N-doped device layer about 300 nm thick using a hard mask for silicon fin etching. Additionally, a fin pattern having a thickness of 20~100 nm is transcribed by E-beam lithography.

After the fin pattern has been transcribed, a fin FET body is formed on the SiO2/SOI substrate by RIE (reactive ion etch) using the fin pattern as an etch mask. Subsequently, a sacrifice silicon oxide layer is grown about 70 nm thick and is then removed to restore sidewalls damaged by RIE. High-K dielectric is deposited 5~10 nm thick as a gate dielectric 60. In doing so, HfO2, Ta2O5, ZrO2 or the like is used as a raw material of the high-K dielectric. A metal layer is deposited about 400 nm thick by physical vapor deposition (PVD) to form a gate. In doing so, a Ru—Ta, TaN (cube and hexagonal), or Mo based metal is used as a gate electrode material. The metal layer is then planarized to the height of a hard oxide mask by CMP (chemical mechanical polishing). A silicon nitride (Si3N4) layer is deposited as a hard mask for forming a pattern on the metal layer by CVD (chemical vapor deposition). Patterning is then carried out by DUV (deep ultraviolet). After completion of the patterning, a metal gate 50 is formed by etch using a pattern formed by the patterning as an etch mask and the remaining hard oxide mask is removed by HF.

Additionally, a sidewall oxide is grown about 75 nm thick to prevent shorting of the metal gate and to protect a silicon layer from source/drain ion implantation. Subsequently, source/drain ion implantation is carried out on the substrate using As or B as a dopant. Thereafter, RTA (rapid thermal annealing) is the carried out on the substrate. In FIG. 2, reference numbers 10, 20, 30, 40, 50, and 60 indicate buried oxide, Si, pad oxide, Si3N4, Metal gate, and high-K dielectric, respectively.

Accordingly, with the example fabrication method described herein, metal and high-K dielectric are used as a gate material and a gate dielectric, respectively, whereby a variation of a threshold voltage of a PMOS/NMOS device due to a work function difference is appropriately adjusted. Additionally, the example fabrication method described herein can reduce leakage current and ensures electrical stability of the device operation.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:
1. A method of fabricating a fin field effect transistor, comprising:
   forming a thermal oxide layer as a hard mask for etching a silicon fin on an SOI substrate;
   transcribing a fin pattern;
   forming a fin FET body by etching using the fin pattern as an etch mask;
   growing a sacrificial silicon oxide layer to restore a sidewall damaged by the etching;
   removing the sacrificial silicon oxide layer;
   depositing a high-K dielectric as a gate dielectric;
   depositing a metal layer;
   planarizing the metal layer to a height of a hard oxide;
   forming a nitride layer on the planarized metal layer;
   patterning the nitride layer using a hard oxide mask for forming a pattern to form a nitride layer pattern;
   forming a metal gate using the nitride layer pattern;

removing a remaining hard oxide mask using high frequency; and growing a sidewall oxide layer on the metal gate.

2. The method of claim 1, wherein one selected from the group consisting of $HfO_2$, $Ta_2O_5$, and $ZrO_2$ is used as a raw material of the high-K dielectric.

3. The method of claim 1, wherein the metal gate is formed of one selected from Ru—Ta, TaN, and Mo based metals.

* * * * *